(12) United States Patent
Itoh et al.

(10) Patent No.: US 7,397,063 B2
(45) Date of Patent: Jul. 8, 2008

(54) SEMICONDUCTOR DEVICE

(75) Inventors: Yasuyoshi Itoh, Hyogo (JP); Kaoru Motonami, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 11 days.

(21) Appl. No.: 10/898,360

(22) Filed: Jul. 26, 2004

(65) Prior Publication Data

US 2005/0045880 A1   Mar. 3, 2005

(30) Foreign Application Priority Data

Aug. 27, 2003   (JP)   ............... 2003-303043
Jun. 23, 2004   (JP)   ............... 2004-185085

(51) Int. Cl.
 *H01L 29/04*   (2006.01)

(52) U.S. Cl. ............... 257/52; 257/16; 257/57; 257/913; 257/E21.318; 257/E21.321; 257/E21.412; 257/E21.413; 257/E21.414; 257/E23.122

(58) Field of Classification Search ......... 257/72, 257/49, 57, 59, 65, 316, 66, 347, 16, 52, 257/913, E21.318, E21.321, E21.412–E21.414, 257/E23.122
See application file for complete search history.

(56) References Cited

U.S. PATENT DOCUMENTS 5,311,041 A   5/1994   Tominaga et al.
6,432,786 B2 *   8/2002   Chen et al. ............... 438/305
6,548,422 B1 *   4/2003   Roy et al. ............... 438/775
6,828,587 B2 *   12/2004   Yamazaki et al. ............... 257/72
2002/0182828 A1   12/2002   Asami et al.
2003/0201442 A1 *   10/2003   Makita

FOREIGN PATENT DOCUMENTS

| JP | 404127437 A | * | 4/1992 |
| JP | 05-109737 A | | 4/1993 |
| JP | 9-172179 | | 6/1997 |
| JP | 2000-269133 | | 9/2000 |
| JP | 2001-028448 | | 1/2001 |
| JP | 2001144273 | * | 5/2001 |
| JP | 2002134721 | * | 10/2002 |
| JP | 2002-367904 | | 12/2002 |
| KR | 2002-0092255 A | | 12/2002 |

* cited by examiner

*Primary Examiner*—Andy Huynh
(74) *Attorney, Agent, or Firm*—McDermott Will & Emery LLP

(57) ABSTRACT

A semiconductor device comprises a glass substrate serving as a substrate having an insulated surface and a silicon layer located on a position overlapping with this glass substrate. The silicon layer includes an amorphous gettering region. Preferably, the silicon layer includes a main region serving as an active element region, and the gettering region is preferably included in the remaining portion of the silicon layer excluding the main region. Preferably, the silicon layer may include a portion serving as an active region of a thin-film transistor.

7 Claims, 6 Drawing Sheets

SEMICONDUCTOR DEVICE

BACKGROUND OF THE INVENTION

1. Field of the Invention

The present invention relates to a semiconductor device. More specifically, it relates to a semiconductor device including a thin-film transistor (TFT) prepared from crystallized silicon.

2. Description of the Background Art

In order to prepare a thin-film transistor from polycrystalline silicon, a step of crystallizing silicon is generally carried out. In this crystallization step, a treatment referred to as laser annealing is performed by applying a laser beam emitted from an excimer laser such as an Xe—Cl laser to an amorphous silicon film for melting the amorphous silicon film with heat resulting from this lasing and crystallizing the silicon in subsequent cooling. A polycrystalline silicon film can be obtained through this treatment. When the polycrystalline silicon film is prepared by this method, a substrate itself is hardly exposed to heat and hence a material having a low heat-resistant temperature can be employed for the substrate. Thus, a thin-film transistor can be formed on a glass substrate having a low heat-resistant temperature.

However, the laser beam emitted from the excimer laser such as an Xe—Cl laser and applied to the amorphous silicon film reaches only a portion of the silicon layer close to the surface thereof, and hence a layer having a large crystal grain size is formed only around the surface of the silicon layer. In relation to laser annealing, therefore, proposed is application of a YAG laser beam in place of the excimer laser beam.

According to a technique disclosed in Japanese Patent Laying-Open No. 2002-367904, a polycrystalline film formed by solid phase growth is extremely thinly left on a lower portion of a semiconductor film while the remaining region is melted for growing crystals from the left polycrystalline film formed by solid phase growth, as described in section 0033 with reference to FIGS. 1 and 4. In an embodiment of this technique, a heat treatment is performed on an amorphous semiconductor film for crystallizing the amorphous film in a solid phase (section 0059) and applying the second harmonic of an Nd:YAG laser beam to the intrinsic polycrystalline silicon film obtained by solid phase growth for melting/crystallizing the same (section 0060). The aforementioned gazette describes that about 80% of the semiconductor film is melted.

According to a technique disclosed in Japanese Patent Laying-Open No. 2000-269133, the second harmonic of an Nd:YAG laser beam is applied to an intrinsic amorphous silicon film for melting/recrystallizing the same (section 0023). This gazette describes that about 92% of the semiconductor film is melted.

A transistor formed on a silicon substrate has such a property that portions of crystal defects easily trap unnecessary impurities causing deterioration of transistor characteristics. Gettering can be performed through this property. In the transistor formed on the silicon substrate, a gettering site is constituted by depositing polycrystalline silicon on the back surface of the silicon substrate or a forming portion having a large number of crystal defects on the back surface of the silicon substrate by sandblasting or the like.

In a thin-film transistor formed on a glass substrate, on the other hand, the thickness of a silicon layer is so small that it is theoretically possible but inefficient to intentionally deposit a polycrystalline silicon film on the back surface of the silicon layer in consideration of a step necessary for this working. Further, it is impossible to perform a treatment such as sandblasting on the back surface of the silicon layer. In the thin-film transistor formed on a glass substrate, therefore, a gettering site must be constituted by another method.

SUMMARY OF THE INVENTION

An object of the present invention is to implement a portion serving as a gettering site in a semiconductor device formed with a substrate such as a glass substrate having an insulated surface.

In order to attain the aforementioned object, a semiconductor device according to the present invention comprises a substrate having an insulated surface and a silicon layer located on a position overlapping with the insulated surface, and the silicon layer includes an amorphous gettering region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
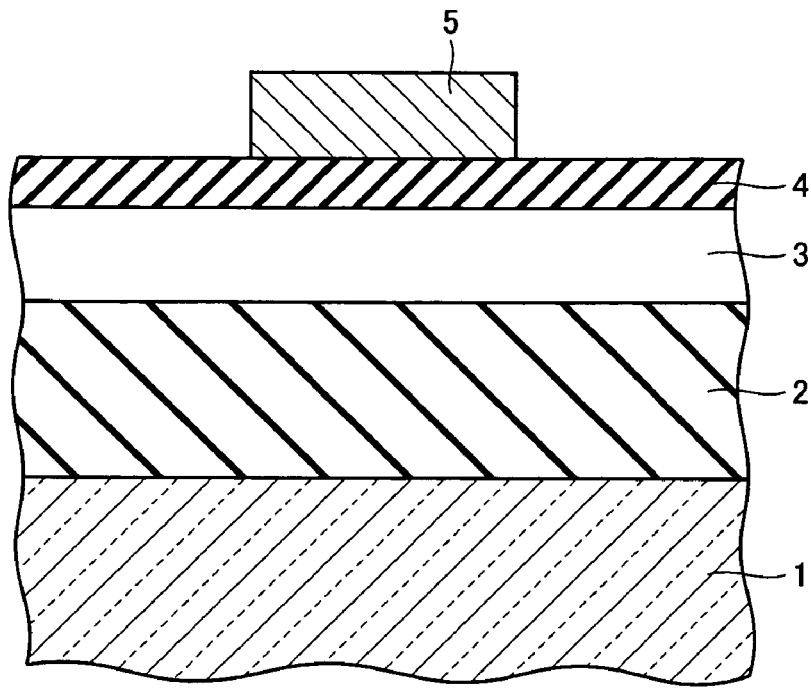
FIG. 1 is a sectional view of a semiconductor device according to a first embodiment of the present invention.
Figure 2:
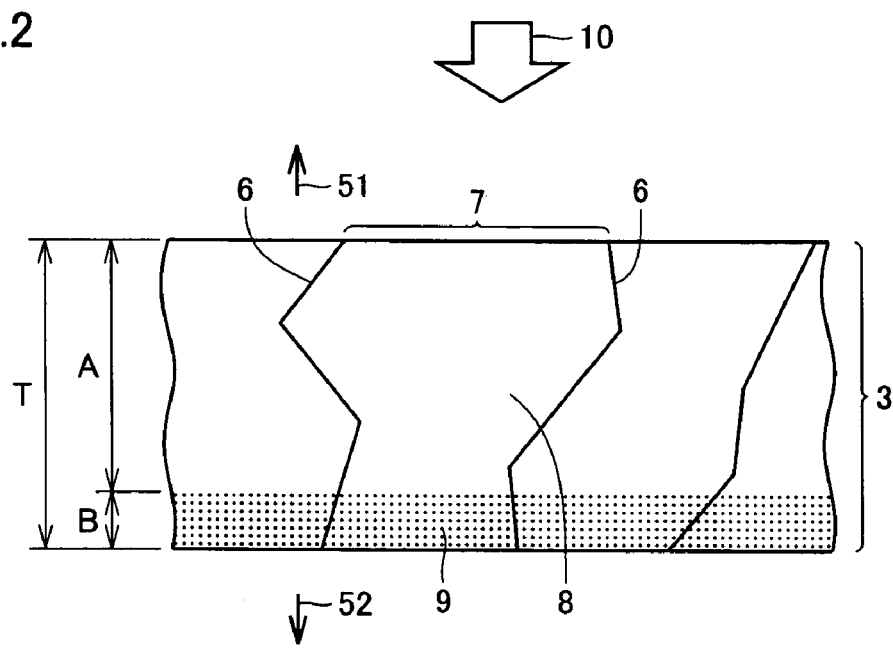
FIG. 2 is an enlarged sectional view of a silicon layer included in the semiconductor device according to the first embodiment of the present invention.

A semiconductor device according to a first embodiment of the present invention is described with reference to FIGS. 1 and 2. This semiconductor device, forming a top gate thin-film transistor, comprises a glass substrate 1 having an insulated surface and a silicon layer 3 overlapping with the glass substrate 1, as shown in FIG. 1. A silicon oxide film 2 serving as the so-called underlayer film is interposed between the glass substrate 1 and the silicon layer 3. The silicon layer 3 includes a main region serving as an active element region. A gate electrode 5 is formed on the silicon layer 3 through a gate insulator film 4. FIG. 2 partially illustrates the silicon layer 3 in an enlarged manner.

Grain boundaries 6 partition the silicon layer 3 into a large number of crystal grains 7. Each crystal grain 7 has a two-layer structure including a first layer 8 formed by a substantially perfect crystal on the side closer to the gate electrode 5 while including a second layer 9 different from the first layer 8 on the side opposite to the gate electrode 5. Referring to FIG. 2, arrows 51 and 52 show the sides closer and opposite to the gate electrode 5 respectively.

This silicon layer 3 is formed by applying a YAG-2ω laser beam along arrow 10 in laser annealing. The transmission property in a polycrystalline silicon portion is improved due to the employment of the YAG-2ω laser beam so that the silicon layer 3 can be melted and recrystallized up to a deep portion. In this laser annealing, the silicon layer 3 is not entirely recrystallized but a portion close to the surface opposite to the gate electrode 5 is intentionally left amorphous with no recrystallization, to form the second layer 9. In other words, the second layer 9 is amorphous. This second layer 9 serves as a gettering region in the silicon layer 3. The gettering region is preferably provided on a portion other than a main region.

Figure 3:
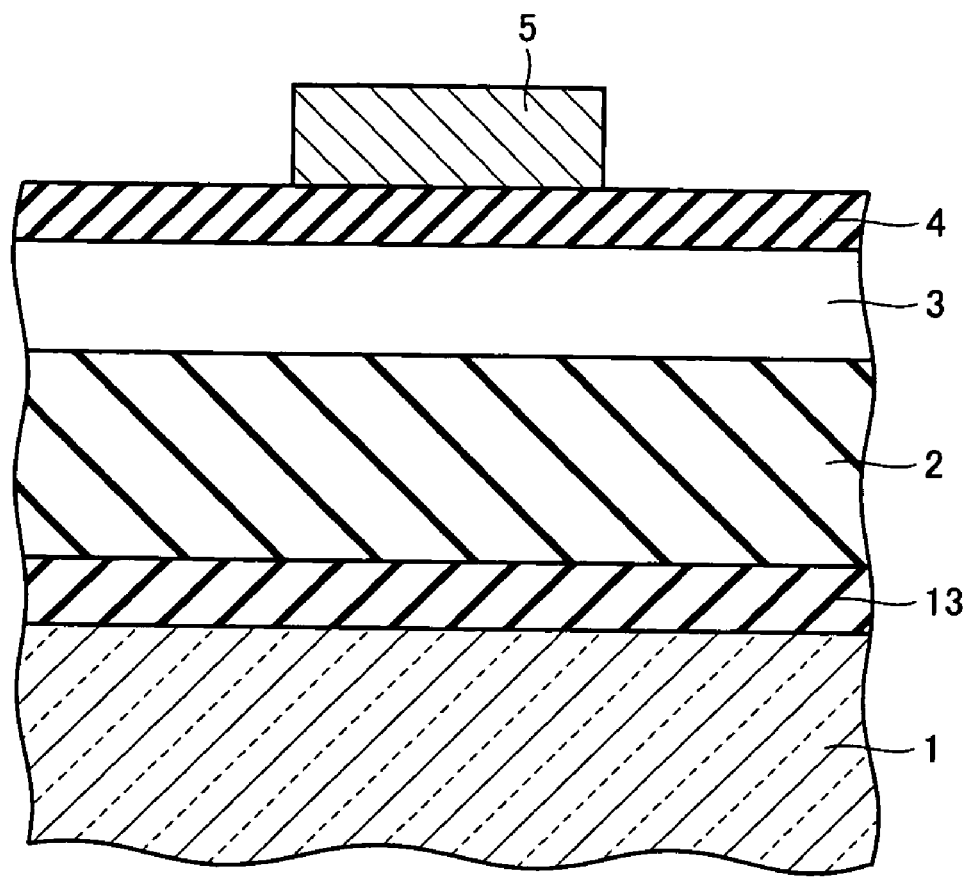
FIG. 3 is a sectional view of a modification of the semiconductor device according to the first embodiment of the present invention.

The underlayer film, consisting of only the silicon oxide film 2 according to the first embodiment, may alternatively be constituted of a laminated body of a silicon oxide film 2 and a silicon nitride film 13, as shown in FIG. 3. In a modification of the first embodiment shown in FIG. 3, the silicon nitride film 13 is arranged between the silicon oxide film 2 and a glass substrate 1.

In the semiconductor device according to the first embodiment, the side of each crystal grain 7 closer to the gate electrode 5 forms the first layer 8 having a large grain size, i.e., excellent crystallinity due to melting and recrystallization resulting from application of the YAG-2ω laser beam. On the side closer to the gate electrode 5, therefore, electron mobility can be improved for implementing a state suitable for high-speed operation. On the other hand, the side of each crystal grain 7 opposite to the gate electrode 5 forms the amorphous second layer 9 serving as a gettering site. Thus, the second layer 9 so captures unnecessary impurities that the operation of the thin-film transistor can be stabilized.

The second layer 9, amorphous in the first embodiment, may not be amorphous but may alternatively include a larger number of small crystal defects as compared with the first layer 8. Also in this case, the second layer 9 can serve as the gettering site due to the presence of the small crystal defects. Further alternatively, the second layer 9 may consist of polycrystalline silicon having a small crystal grain size.

The silicon layer 3, irradiated with the YAG-2ω laser beam in the first embodiment, may alternatively be irradiated with another type of laser beam in laser annealing. In particular, the silicon layer 3 is preferably irradiated with a laser beam having a wavelength λ within the range of at least 370 nm and not more than 710 nm in laser annealing. According to the first embodiment, the silicon layer 3 is exemplarily irradiated with the YAG-2ω laser beam.

While a silicon oxide film or a silicon nitride film is generally arranged between a glass substrate and a silicon layer as an underlayer film in a conventional semiconductor device, this underlayer film may be separated from the glass substrate or the silicon layer in laser annealing due to the difference in expansion coefficient between these layers. In order to prevent this separation, adhesion between these layers must be reinforced. According to the first embodiment of the present invention, the amorphous second layer 9 or an alternative second layer including a larger number of small crystal defects than the first layer 8 is provided in the lower surface of the silicon layer 3, thereby reinforcing adhesion between the silicon layer 3 and the silicon oxide film 2 serving as the underlayer film.

Figure 4:
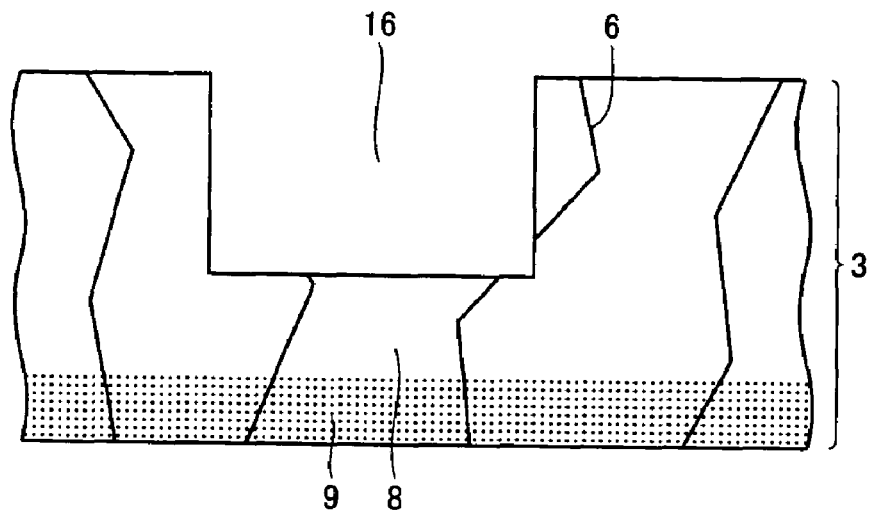
FIG. 4 is an enlarged sectional view showing a contact hole penetrating the silicon layer included in the semiconductor device according to the first embodiment of the present invention.

As shown in FIG. 2, the thickness A of the first layer 8 is preferably larger than the thickness B of the second layer 9. In this case, the bottom surface of a contact hole 16 partially penetrating the silicon layer 3 due to excess etching in formation thereof does not pass through the first layer 8 but remains therein with a high probability, as shown in FIG. 4. When the bottom surface of the contact hole 16 remains in the first layer 8, electric resistance can be suppressed.

Second Embodiment

Figure 5:
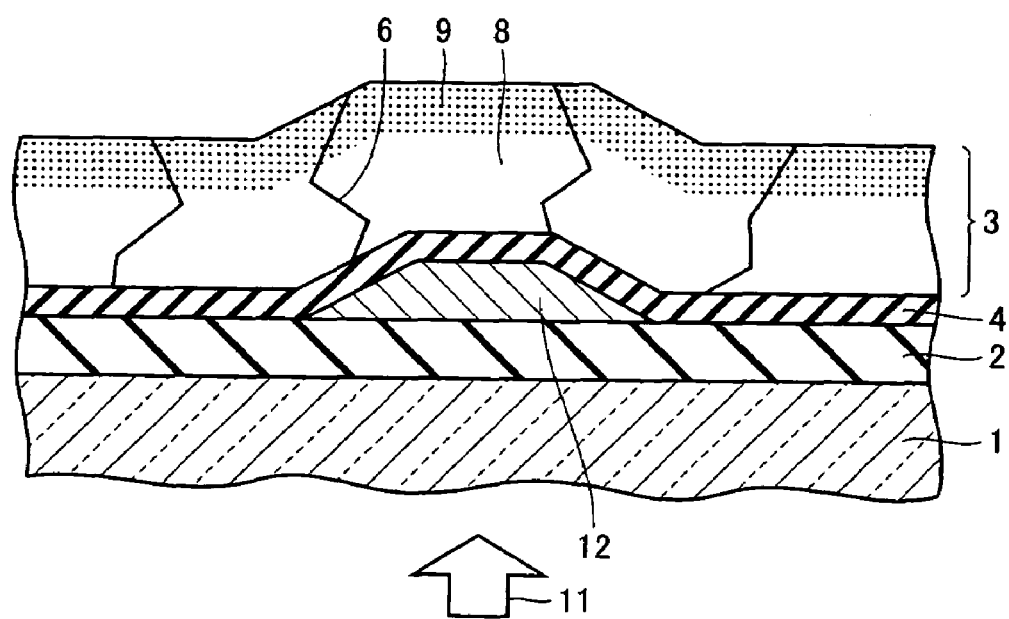
FIG. 5 is a sectional view of a semiconductor device according to a second embodiment of the present invention.

A semiconductor device according to a second embodiment of the present invention is described with reference to FIG. 5. This semiconductor device, forming an inversely staggered thin-film transistor, comprises a glass substrate 1 having an insulated surface and a silicon layer 3 overlapping with the glass substrate 1, as shown in FIG. 5. A silicon oxide film 2 serving as the so-called underlayer film is interposed between the glass substrate 1 and the silicon layer 3, similarly to the top gate thin-film transistor according to the first embodiment. In the inversely staggered thin-film transistor according to the second embodiment, a gate electrode 12 is held between the glass substrate 1 and the silicon layer 3. The gate electrode 12 is locally placed on a flat surface of the glass substrate 1, and covered with a gate insulator film 4 from above. The gate insulator film 4 is covered with the silicon layer 3 from above. Therefore, the shapes of the gate insulator film 4 and the silicon layer 3 reflect the protuberant shape of the gate electrode 12 with respect to the flat surface of the glass substrate 1 as such. Also in the semiconductor device according to the second embodiment, grain boundaries 6 partition the silicon layer 3 into a large number of crystal grains 7, similarly to the first embodiment. Each crystal grain 7 has a two-layer structure including a first layer 8 formed by a substantially perfect crystal on the side closer to the gate electrode 12 while including a second layer 9 different from the first layer 8 on the side opposite to the gate electrode 12, also similarly to the first embodiment. According to the second embodiment, however, the gate electrode 12 is provided under the silicon layer 3 dissimilarly to the first embodiment, and hence the first and second layers 8 and 9 are provided on the lower and upper sides respectively in the silicon layer 3.

This silicon layer 3 is formed by applying a YAG-2ω laser beam along arrow 111 in laser annealing. The applied laser beam is not restricted to the YAG-2ω laser beam but a laser beam having a wavelength λ within the range of at least 370 nm and not more than 710 nm may alternatively be employed. According to the second embodiment, the YAG-2ω laser beam is exemplarily applied. The constitution of the second layer 9 is similar to that of the second layer 9 described with reference to the first embodiment.

Figure 6:
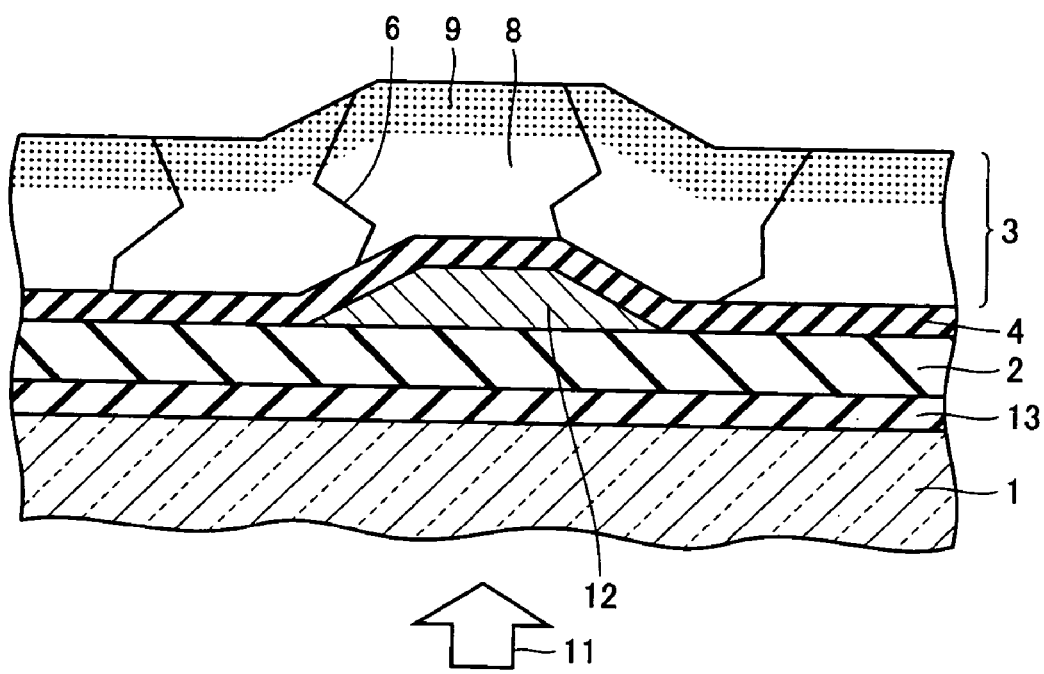
FIG. 6 is a sectional view of a modification of the semiconductor device according to the second embodiment of the present invention.

The underlayer film, consisting of only the silicon oxide film 2 according to the second embodiment, may alternatively be constituted of a laminated body of a silicon oxide film 2 and a silicon nitride film 13, as shown in FIG. 6. In a modification of the second embodiment shown in FIG. 6, the silicon nitride film 13 is arranged between the silicon oxide film 2 and a glass substrate 1.

In the semiconductor device according to the second embodiment, each crystal grain 7 including the first layer 8 having excellent crystallinity and the second layer 9 serving as a gettering site can suppress electric resistance, enable high-speed operation and stabilize the operation of the thin-film transistor due to reliable gettering.

Third Embodiment

Figure 7:
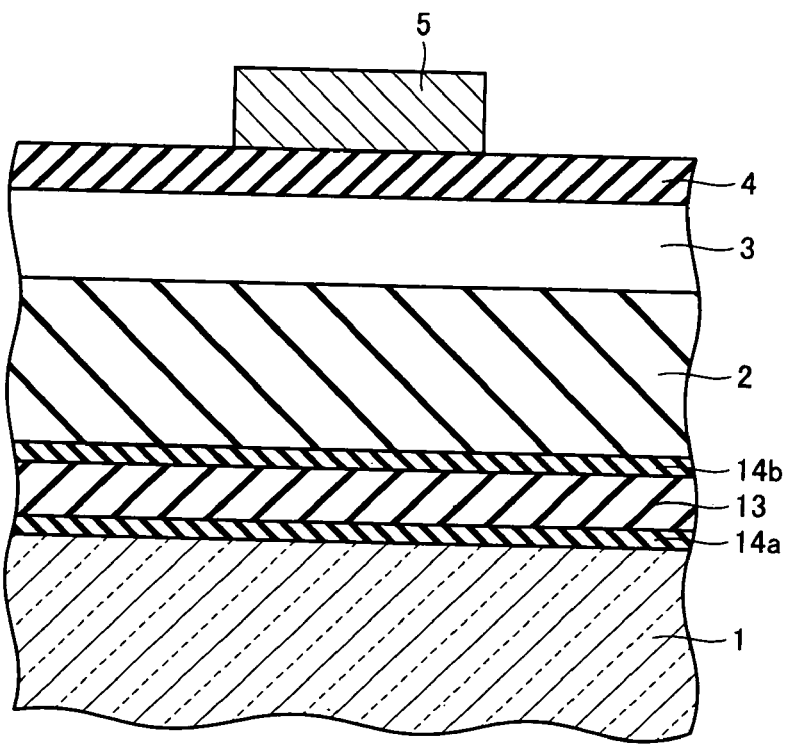
FIG. 7 is a sectional view of a semiconductor device according to a third embodiment of the present invention.

A semiconductor device according to a third embodiment of the present invention is described with reference to FIG. 7. This semiconductor device, forming a top gate thin-film transistor, comprises a structure identical to that described with reference to the first embodiment in a silicon layer 3, while a silicon nitride film 13 is interposed between a glass substrate 1 and a silicon oxide film 2, as shown in FIG. 7. An oxynitride film 14a is interposed between the silicon nitride film 13 and the glass substrate 1. Another oxynitride film 14b is interposed between the silicon nitride film 13 and the silicon oxide film 2. The thickness of the silicon nitride film 13 is 50 nm to 100 nm, while those of the oxynitride films 14a and 14b are several nm to several 10 nm respectively.

According to the third embodiment of the present invention, the oxynitride films 14a and 14b having intermediate expansion coefficients between those of the silicon oxide film 2 and the silicon nitride film 13 are formed on lower and upper interfaces of the silicon nitride film 13 respectively, thereby reinforcing adhesion between the silicon oxide film 2 and the silicon nitride film 13 as well as that between the silicon nitride film 13 and the glass substrate 1. Thus, the silicon layer 3 and the glass substrate 1 can be prevented from separating from each other.

Figure 8:
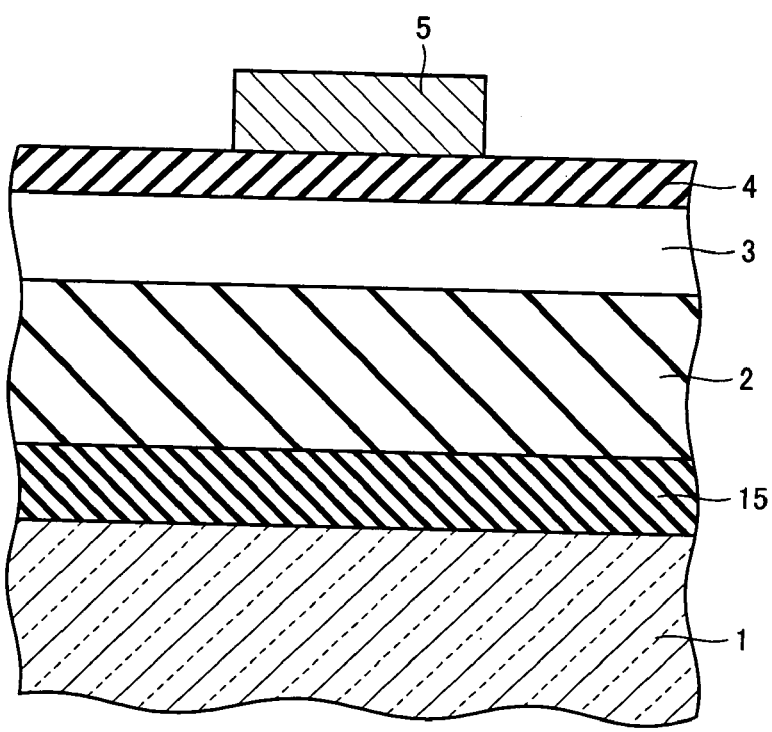
FIG. 8 is a sectional view of a first modification of the semiconductor device according to the third embodiment of the present invention.

The silicon nitride film 13 may be so omitted that a glass substrate 1 and a silicon oxide film 2 are in contact with each other through an oxynitride film 15 as in a modification of the third embodiment shown in FIG. 8. Also in this case, a silicon layer 3 and the glass substrate 1 can be prevented from separating from each other.

Figure 9:
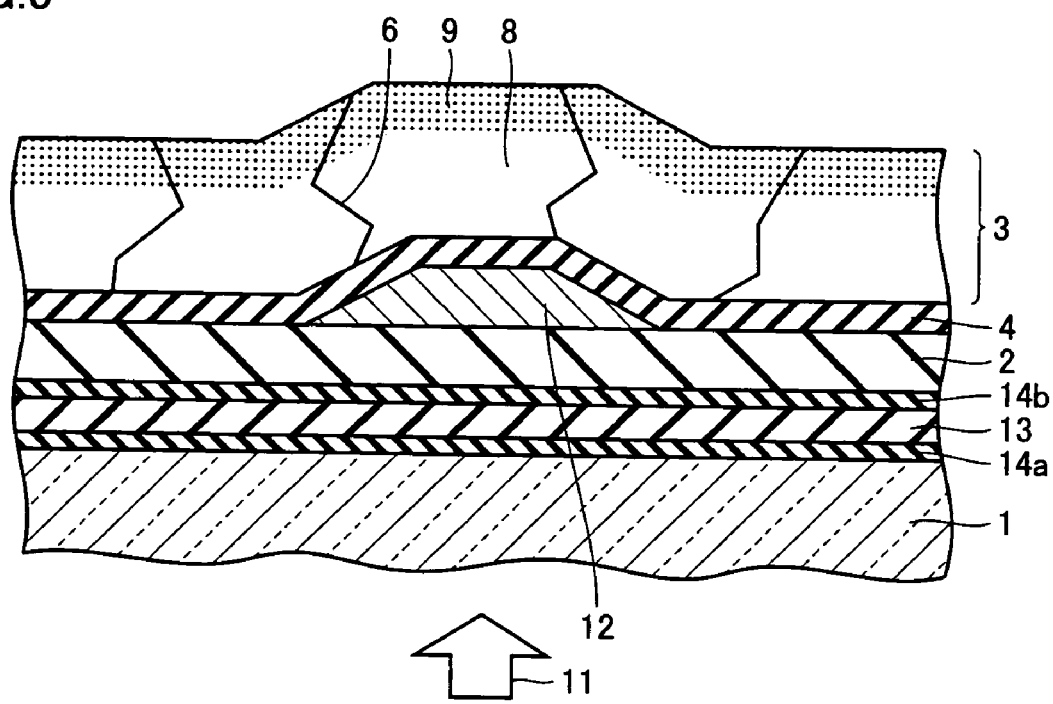
FIG. 9 is a sectional view of a second modification of the semiconductor device according to the third embodiment of the present invention.

The third embodiment of the present invention, applied to a top gate thin-film transistor as shown in FIG. 7 or 8, is also applicable to an inversely staggered thin-film transistor as in another modification of the third embodiment shown in FIG. 9. Referring to FIG. 9, a glass substrate 1 and a silicon oxide film 2 hold a silicon nitride film 13 therebetween, while oxynitride films 14a and 14b are formed on lower and upper interfaces of the silicon nitride film 13 respectively. Also in this case, the glass substrate 1 can be prevented from separating from a silicon layer 3.

The semiconductor device according to each of the aforementioned embodiments forms a thin-film transistor. In this case, the silicon layer 3 includes a portion serving as an active region of the thin-film transistor. However, the present invention is not restricted to the thin-film transistor. The surface of the silicon layer 3 according to the present invention exposing the first layer 8 is also employable for another application as a silicon active region. For example, the present invention can also be employed for forming an element such as a capacitor. In this case, the silicon layer 3 includes a portion forming one of electrodes constituting the capacitor. Further alternatively, the silicon layer 3 may include a portion serving as a contact part with another layer, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a substrate having an insulated surface with an insulating film thereon; and
   a silicon layer located on a position overlapping with said insulated surface and having a thickness orthogonal to the insulated surface; wherein
   said silicon layer includes an amorphous gettering region in contact with the insulating film, the gettering region having a thickness less than the thickness of the silicon layer; and wherein
   said silicon layer includes a main region serving as an active element region, and
   said gettering region is exclusive of said main region, the main region separated from the insulating film by the gettering region.

2. The semiconductor device according to claim 1, wherein said silicon layer includes a portion serving as an active region of a thin-film transistor.

3. The semiconductor device according to claim 1, wherein said silicon layer includes a portion serving as one of electrodes constituting a capacitor.

4. The semiconductor device according to claim 1, wherein said silicon layer includes a portion serving as a contact part with another layer.

5. The semiconductor device according to claim 1, wherein the insulating film comprises an oxide film between said insulated surface and said silicon layer, and wherein
   an oxynitride film is arranged between said oxide film and said substrate having said insulated surface.

6. The semiconductor device according to claim 1, wherein the insulating film comprises an oxide film and a nitride film between said insulated surface and said silicon layer, wherein
   an oxynitride film is arranged between said nitride film and said substrate having said insulated surface.

7. The semiconductor device according to claim 1, wherein the insulating film comprises an oxide film and a nitride film between said insulated surface and said silicon layer, wherein
   oxynitride films are arranged between said nitride film and said substrate having said insulated surface and between said oxide film and said nitride film respectively.

* * * * *